United States Patent
Hai et al.

(10) Patent No.: US 11,118,976 B2
(45) Date of Patent: Sep. 14, 2021

(54) TEXTURE RECOGNITION DEVICE AND DISPLAY PANEL

(71) Applicant: BOE Technology Group Co., Ltd., Beijing (CN)

(72) Inventors: Xiaoquan Hai, Beijing (CN); Haisheng Wang, Beijing (CN); Jian Gao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 198 days.

(21) Appl. No.: 16/558,754

(22) Filed: Sep. 3, 2019

(65) Prior Publication Data
US 2020/0173856 A1 Jun. 4, 2020

(30) Foreign Application Priority Data
Nov. 30, 2018 (CN) .......................... 201811457073.8

(51) Int. Cl.
*G06K 9/00* (2006.01)
*G01J 3/50* (2006.01)
(Continued)

(52) U.S. Cl.
CPC ............... *G01J 3/506* (2013.01); *G06T 7/40* (2013.01); *G09G 3/006* (2013.01); *H01L 51/5012* (2013.01); *G06T 2207/30121* (2013.01)

(58) Field of Classification Search
CPC .. G01J 3/506; G06T 7/40; G06T 2207/30121; G09G 3/006; H01L 51/5012;
(Continued)

(56) References Cited

U.S. PATENT DOCUMENTS 10,460,147 B2 * 10/2019 Yang .................... G06K 9/0004
10,998,388 B2 * 5/2021 Jin ........................ G06F 1/1684
(Continued)

FOREIGN PATENT DOCUMENTS

CN        104466032 A  *  3/2015
CN        105336872 A  *  2/2016
(Continued)

OTHER PUBLICATIONS

Office Action of CN Application No. 201811457073.8 and English translation, dated Apr. 3, 2020, 15 pages.

*Primary Examiner* — Mahendra R Patel
(74) *Attorney, Agent, or Firm* — Muncy, Geissler, Olds and Lowe, P.C.

(57) ABSTRACT

A texture recognition device and a self-luminous display panel. The texture recognition device includes a substrate, an optical sensing layer, and a light-blocking structure. The optical sensing layer and the light-blocking structure are stacked on the substrate. The light-blocking structure includes a plurality of light transmission hole groups, at least one of which includes $C^2$ light transmission holes. C is a positive integer. The optical sensing layer includes multiple optical sensing groups. The multiple optical sensing groups corresponds to the multiple light transmission hole groups respectively. An orthogonal projection of one optical sensing group on the substrate completely covers an orthogonal projection of a corresponding light transmission hole group on the substrate, and an orthogonal projection of a center of the optical sensing group on the substrate coincides with an orthogonal projection of a center of the corresponding light transmission hole group on the substrate.

13 Claims, 5 Drawing Sheets

(51) Int. Cl.
  *G06T 7/40* (2017.01)
  *G09G 3/00* (2006.01)
  *H01L 51/50* (2006.01)

(58) Field of Classification Search
  CPC ............. H01L 51/5284; H01L 27/3234; H01L 2924/00; G06K 9/0004; G09F 9/33; H04N 2201/03141; G02F 1/133512
  USPC ........................................................ 382/108
  See application file for complete search history.

(56) References Cited

U.S. PATENT DOCUMENTS

| | | | | |
|---|---|---|---|---|
| 2004/0046495 | A1* | 3/2004 | Peng | H05B 33/14 313/504 |
| 2008/0237770 | A1* | 10/2008 | Iwazaki | H01L 27/14618 257/448 |
| 2008/0238307 | A1* | 10/2008 | Tobise | H01L 51/005 313/504 |
| 2008/0297726 | A1* | 12/2008 | Rodriguez, Jr. | G02B 13/16 353/13 |
| 2008/0316740 | A1* | 12/2008 | Okawa | B60Q 3/85 362/231 |
| 2010/0129073 | A1* | 5/2010 | Hamana | H04L 7/0037 398/25 |
| 2010/0307560 | A1* | 12/2010 | Baker | H01L 31/0296 136/244 |
| 2011/0088742 | A1* | 4/2011 | Casler | H01L 31/046 136/244 |
| 2017/0045985 | A1* | 2/2017 | Lv | G06F 3/04164 |
| 2017/0307932 | A1* | 10/2017 | Lee | G02F 1/133553 |
| 2018/0012069 | A1 | 1/2018 | Chung et al. | |
| 2018/0081100 | A1* | 3/2018 | Wang | G02B 5/282 |
| 2018/0373945 | A1* | 12/2018 | Wu | G02B 27/0988 |
| 2019/0026530 | A1 | 1/2019 | Wu et al. | |
| 2019/0205592 | A1 | 7/2019 | Cao et al. | |
| 2019/0243154 | A1 | 8/2019 | Hai et al. | |
| 2019/0286869 | A1* | 9/2019 | Ling | H01L 27/3234 |
| 2019/0303639 | A1* | 10/2019 | He | G06K 9/0012 |

FOREIGN PATENT DOCUMENTS

| | | |
|---|---|---|
| CN | 106022324 A | 10/2016 |
| CN | 107368822 A | 11/2017 |
| CN | 108073912 A | 5/2018 |
| CN | 108227230 A | 6/2018 |
| CN | 109053555 A * | 12/2018 |

* cited by examiner

TEXTURE RECOGNITION DEVICE AND DISPLAY PANEL

CROSS-REFERENCES TO RELATED APPLICATIONS

This application claims priority to the Chinese patent application No. 201811457073.8, filed on Nov. 30, 2018, the disclosure of which is hereby incorporated by reference in its entirety.

TECHNICAL FIELD

The present disclosure relates to the display technology field, and, in particular, to a texture recognition device and a display panel.

BACKGROUND

In the optical fingerprint recognition, in the case where a distance between a finger and an optical sensor is large, after light is reflected by the finger or other object, the light may be scattered, which generates a blurred fingerprint image and further causes that texture information acquired according to light received by an optical sensor is not accurate.

SUMMARY

Various embodiments of the present disclosure provide a texture recognition device. The texture recognition device includes a substrate, an optical sensing layer, and a light-blocking structure.

The optical sensing layer and the light-blocking structure are stacked on the substrate.

The light-blocking structure includes a plurality of light transmission hole groups. At least one of the plurality of light transmission hole groups includes $C^2$ light transmission holes, where C is a positive integer.

The optical sensing layer includes multiple optical sensing groups.

The plurality of optical sensing groups corresponds to the plurality of light transmission hole groups respectively. An orthogonal projection of one optical sensing group of the plurality of optical sensing groups on the substrate completely covers an orthogonal projection of a corresponding light transmission hole group of the plurality of light transmission hole groups on the substrate. An orthogonal projection of a center of the optical sensing group on the substrate coincides with an orthogonal projection of a center of the corresponding light transmission hole group on the substrate.

In some embodiments, C satisfies:

$$(C-1) \times s + d + 2h \times \tan\frac{\theta}{2} \leq C \times s \leq K, \text{ and } p = C \times s.$$

d denotes an aperture size of each of the $C^2$ transmission holes, h denotes a distance between the light-blocking structure and the optical sensing layer, θ denotes a light convergence angle, s denotes a distance between centers of two adjacent light transmission holes of the $C^2$ light transmission holes, p denotes a distance between centers of two adjacent optical sensing groups of the plurality of optical sensing groups, and K is a constant and denotes a minimum distance between the centers of two adjacent optical sensing groups in a case where there is a plurality of optical sensing elements per inch and each optical sensing group includes at least one optical sensing element.

In some embodiments, a distance s between centers of two adjacent light transmission holes of the $C^2$ light transmission holes satisfies:

$$s = \frac{p}{C},$$

where p denotes a distance between centers of two optical sensing groups.

In some embodiments, a aperture size d of each of the $C^2$ light transmission holes satisfies:

$$d = p - (C-1) \times s - 2h \times \tan\frac{\theta}{2},$$

where h denotes a distance between the light-blocking structure and the optical sensing layer, and θ denotes a light convergence angle.

In some embodiments, at least one of the plurality of optical sensing groups includes one optical sensing element.

In some embodiments, the optical sensing layer and the light-blocking structure are arranged on a same side of the substrate.

In some embodiments, the light-blocking structure is between the optical sensing layer and the substrate, or the optical sensing layer is between the light-blocking structure and the substrate.

In some embodiments, the optical sensing layer is arranged on a first side of the substrate and the light-blocking structure is arranged on a second side of the substrate, where the first side and the second side are arranged opposite to each other.

In some embodiments, in a direction from the light-blocking structure to the optical sensing layer, the light-blocking structure includes at least three light-blocking layers and light transmission layers each disposed between adjacent light-blocking layers of the at least three light-blocking layers. Each of the $C^2$ light transmission holes runs through the at least three light-blocking layers.

Various embodiments of the present disclosure provide a display panel. The display panel includes any one of the texture recognition devices above and a luminescent device.

The luminescent device includes a light emission side and a backlight side arranged opposite to the light emission side. The texture recognition device is arranged on the backlight side of the luminescent device, and the light-blocking structure is arranged at a side of the optical sensing layer close to the luminescent device.

In some embodiments, $$(C-1) \times s + d + 2h \times \tan\frac{\theta}{2} \leq C \times s \leq K, \text{ and } p = C \times s.$$

d denotes an aperture size of each of the $C^2$ transmission holes, h denotes a distance between the light-blocking structure and the optical sensing layer, θ denotes a light convergence angle, s denotes a distance between centers of two adjacent light transmission holes of the $C^2$ light transmission holes, p denotes a distance between centers of two adjacent optical sensing groups of the plurality of optical sensing groups, and K is a constant and denotes a minimum distance between the centers of two adjacent optical sensing groups in a case where there is a plurality of optical sensing elements per inch and each optical sensing group includes at least one optical sensing element.

In some embodiments, the distance s between centers of two adjacent light transmission holes of the $C^2$ light transmission holes satisfies:

$$s = \frac{p}{C},$$

where p denotes a distance between centers of two optical sensing groups of the plurality of optical sensing groups.

In some embodiments, an aperture size d of each of the $C^2$ light transmission holes satisfies:

$$d = p - (C-1) \times s - 2h \times \tan\frac{\theta}{2},$$

where h denotes a distance between the light-blocking structure and the optical sensing layer, and θ denotes a light convergence angle.

In some embodiments, at least one of the plurality of optical sensing groups includes one optical sensing element.

In some embodiments, the optical sensing layer and the light-blocking structure are both arranged on a side of the substrate away from the luminescent device.

In some embodiments, in a direction from the light-blocking structure to the optical sensing layer, the light-blocking structure includes at least three light-blocking layers and light transmission layers each disposed between adjacent light-blocking layers of the at least three light-blocking layers. Each of the $C^2$ light transmission holes runs through the at least three light-blocking layers.

In some embodiments, the display panel further includes a thin film transistor disposed on the substrate. A drain of the thin film transistor is electrically connected to an anode layer of the luminescent device.

In some embodiments, the optical sensing layer and the light-blocking structure are both arranged on a side of the thin film transistor away from the luminescent device.

In some embodiments, the display panel is an organic light-emitting diode (OLED) display panel or a quantum dot display panel.

BRIEF DESCRIPTION OF DRAWINGS

To more clearly describe technical solutions in embodiments of the present disclosure or in the related art, accompanying drawings for describing the embodiments or the related art are briefly described below. Apparently, the accompanying drawings in the following description are merely some embodiments of the present disclosure, other drawings can be obtained according to these accompanying drawings by those skilled in the art without creative effort.

DETAILED DESCRIPTION

The technical solutions in the embodiments of the present disclosure are clearly and completely described below with reference to the accompanying drawings in the embodiments of the present disclosure. Apparently, the described embodiments are merely a part of embodiments of the present disclosure, not all of the embodiments. Other embodiments obtained by persons of ordinary skills in the art based on the embodiments of the present disclosure without creative efforts fall within the scope of the present disclosure.

In the related art, a light-blocking structure including a plurality of light transmission holes is provided between optical sensing groups and a finger for fingerprint recognition so as to improve the accuracy of the fingerprint recognition.

Figure 1:
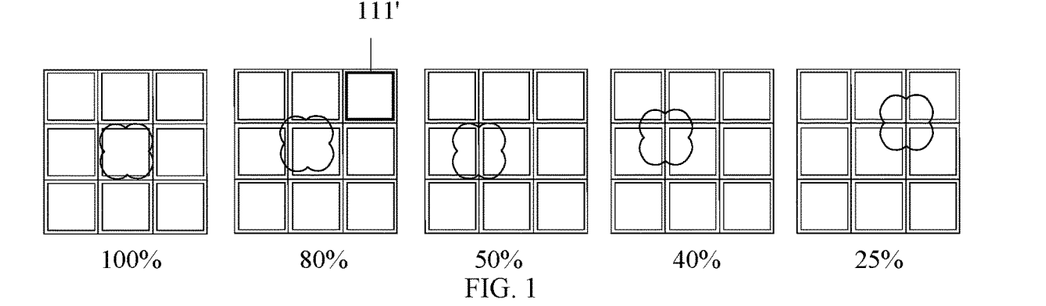
FIG. 1 is a schematic view showing light irradiation areas on optical sensing groups in the related art.
Figure 2:
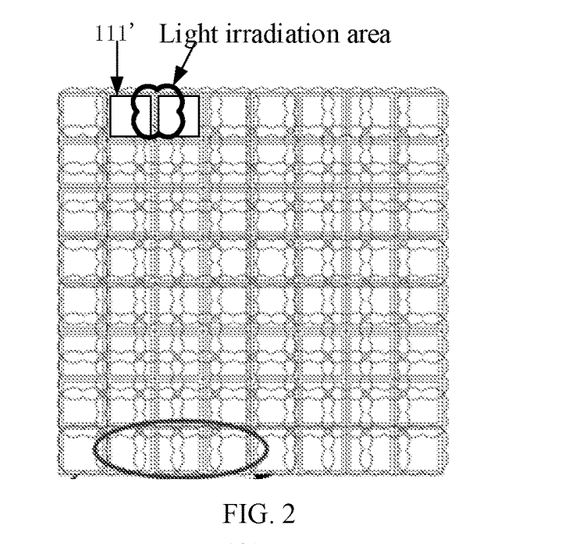
FIG. 2 is an another schematic view showing light irradiation areas on optical sensing groups in the related art.

However, in a case where the light transmission holes and the optical sensing groups are not arranged at proper positions, as shown in FIG. 1 and FIG. 2, light passing through a certain light transmission hole may be irradiated on multiple texture sensing units 111'. As a result, a utilization of the optical sensing groups is poor, and a valley-ridge contrast is affected, thereby affecting the accuracy of the fingerprint recognition.

Embodiments of the present disclosure provide a texture recognition device. As shown in FIG. 3 to FIG. 6, a texture recognition device includes a substrate 10, a light sensing layer 11, and a light-blocking structure 12. The light sensing layer 11, the light-blocking structure 12 and the substrate 10 are stacked. The light-blocking structure 12 includes a plurality of light transmission hole groups 121. At least one light transmission hole group 121 includes $C^2$ light transmission holes 1211, where C is a positive integer (e.g., 2, 3, 4, 5 and so on). The optical sensing layer 11 includes a plurality of optical sensing groups 111. The plurality of optical sensing groups 111 corresponds with the plurality of light transmission hole groups 121 respectively. An orthogonal projection of one optical sensing group of the plurality of optical sensing groups 111 on the substrate 10 completely covers an orthogonal projection of a corresponding light transmission hole group of the plurality of light transmission hole groups 121, and an orthogonal projection of a center of the optical sensing group on the substrate coincides with an orthogonal projection of a center of the corresponding light transmission hole group on the substrate.

Light that is reflected by an object to be detected having texture passes through the light transmission hole groups 121, and then is irradiated on the optical sensing groups 111. In this way, texture recognition is performed.

In some embodiments of the present disclosure, the object to be detected having texture may be a finger or a palm. Hereafter, the description is made with the object to be detected being a finger.

Figure 3:
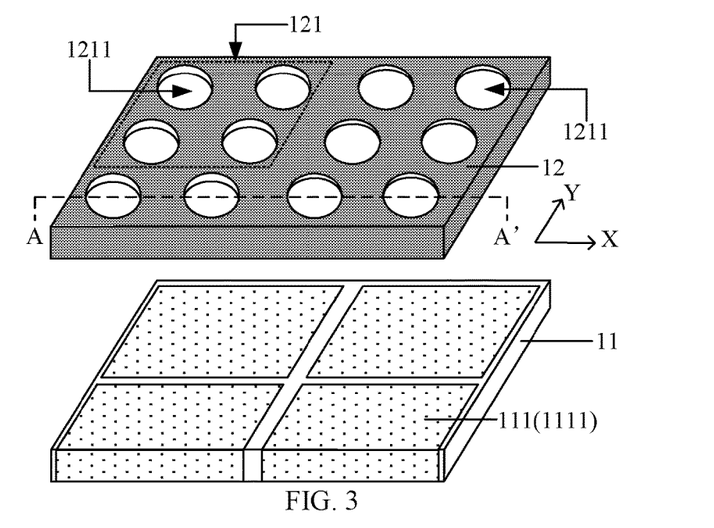
FIG. 3 is a schematic view showing a texture recognition device according to some embodiments of the present disclosure.

In some embodiments of the present disclosure, as shown in FIG. 3, each optical sensing group 111 includes only one optical sensing element 1111.

Figure 4:
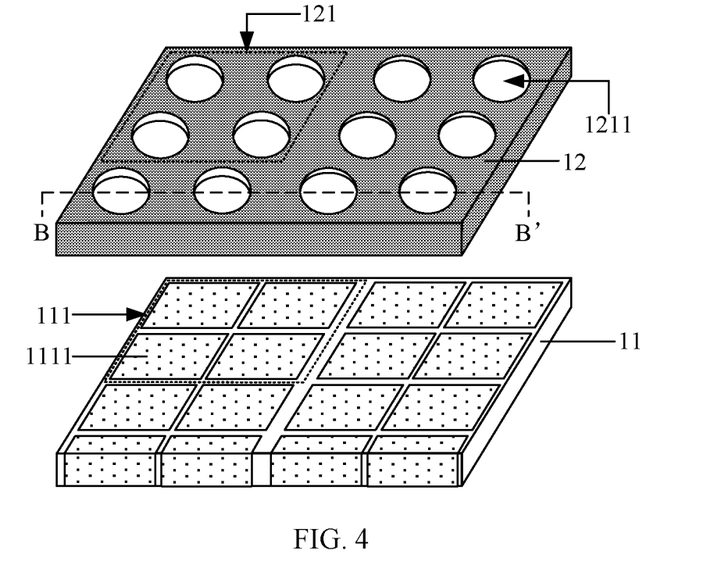
FIG. 4 is a schematic view showing a texture recognition device according to some other embodiments of the present disclosure.

In some embodiments of the present disclosure, as shown in FIG. 4, each optical sensing group 111 includes a plurality of optical sensing elements 1111.

In an exemplary embodiment, the number of optical sensing elements 1111 in one optical sensing group 111 is determined according to the number of light transmission holes 1211 in one light transmission hole group 121 (namely, $C^2$) and a distance between the light-blocking structure 12 and the optical sensing layer 11. In the texture recognition device provided by the present disclosure, lights transmitted through a plurality of light transmission hole groups 121 irradiating to one optical sensing group 111 is avoid.

Figure 7:
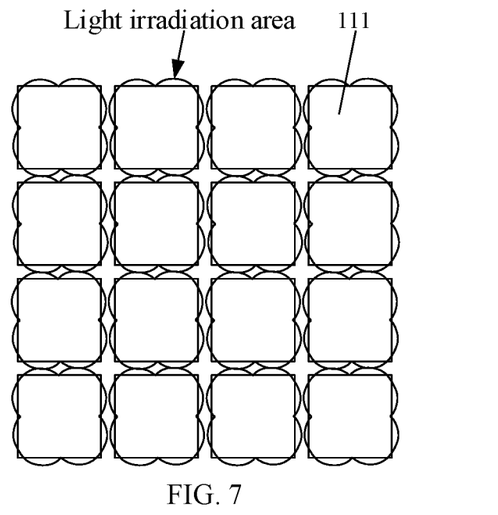
FIG. 7 is a schematic view showing light irradiation areas on optical sensing groups according to some embodiments of the present disclosure.

Exemplarily, in an instance where the number of light transmission holes 1211 in one light transmission hole group 121 and the distance between the light-blocking structure 12 and the optical sensing layer 11 are determined, the number of optical sensing elements 1111 in one optical sensing group 111 is determined according to a size of the optical sensing element 1111 and a distance between centers of two adjacent optical sensing elements 1111, leading that the orthogonal projection of the optical sensing group 111 on the substrate 10 completely covers the orthogonal projection of the corresponding light transmission hole group 121 on the substrate 10, and one optical sensing group 111 is irradiated by light from only one light transmission hole group 121 (as shown in FIG. 7).

In some embodiments of the present disclosure, the number of light transmission holes 1211 in one light transmission hole group 121 is related to the size of one optical sensing group 111 and the distance between the light-blocking structure 12 and the optical sensing layer 11. Based on this, in some embodiments of the present disclosure, lights transmitted through a plurality of light transmission hole groups 121 irradiating to one optical sensing group 111 is avoid.

Exemplarily, in an instance where the size of one optical sensing group 111 and the distance between the light-blocking structure 12 and the optical sensing layer 11, the number of light transmission holes 1211 in one light transmission hole group 121 is determined according to the size of one light transmission hole 1211 and a distance between centers of two adjacent light transmission holes 1211, leading that the orthogonal projection of the optical sensing group 111 on the substrate 10 completely covers the orthogonal projection of the corresponding light transmission hole group 121 on the substrate 10, and one optical sensing group 111 is irradiated by light from only one light transmission hole group 121 (as shown in FIG. 7).

In some embodiments of the present disclosure, the optical sensing group 111 is configured to convert a light signal to an electronic signal. For example, the optical sensing group 111 is a photosensitive sensor or a photosensor.

Figure 5:
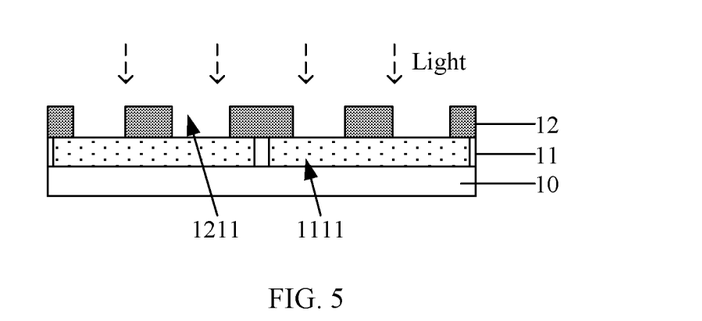
FIG. 5 is a sectional view of the texture recognition device along the section line AA' in FIG. 3 according to some embodiments of the present disclosure.

In some embodiments of the present disclosure, as shown in FIG. 5, the light-blocking structure 12 and the optical sensing layer 11 are in contact with each other.

Figure 6:
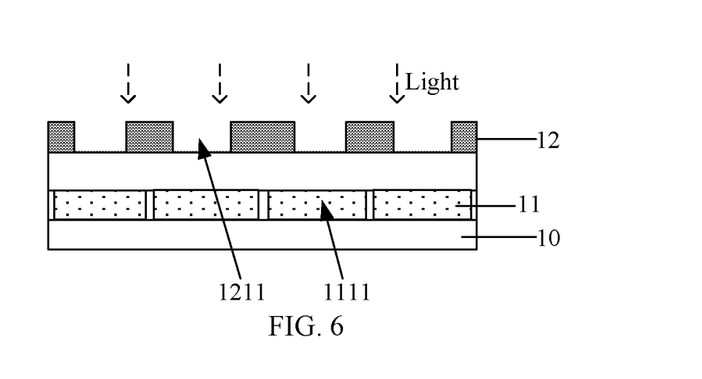
FIG. 6 is a sectional view of the texture recognition device along the section line BB' in FIG. 4 according to some embodiments of the present disclosure.

In other embodiments of the present disclosure, as shown in FIG. 6, the light-blocking structure 12 and the optical sensing layer 11 are spaced apart from each other.

In some embodiments of the present disclosure, the shape of the light transmission hole 1211 is a circle, a rectangle or a polygon.

In some embodiments of the present disclosure, the optical sensing layer 11 and the light-blocking structure 12 are stacked on the substrate 10. For example, as shown in FIG. 5 and FIG. 6, both the optical sensing layer 11 and the light-blocking structure 12 are arranged on a first side of the substrate 10, and the optical sensing layer 11 and the light-blocking structure 12 are stacked on the substrate 10 in order.

Figure 8:
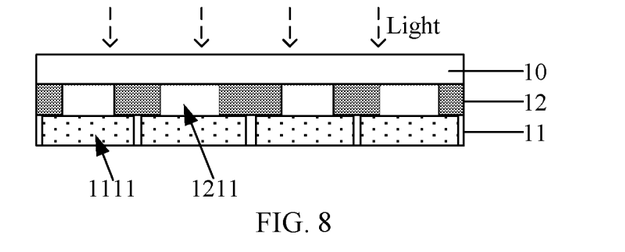
FIG. 8 is a sectional view of the texture recognition device along the section line BB' in FIG. 4 according to some other embodiments of the present disclosure.

In other embodiments of the present disclosure, as shown in FIG. 8, both the optical sensing layer 11 and the light-blocking structure 12 are arranged on a second side of the substrate 10, and the optical sensing layer 11 and the light-blocking structure 12 are stacked on the substrate 10 in order.

The first side of the substrate 10 and the second side of the substrate 10 are arranged opposite to each other.

Figure 9:
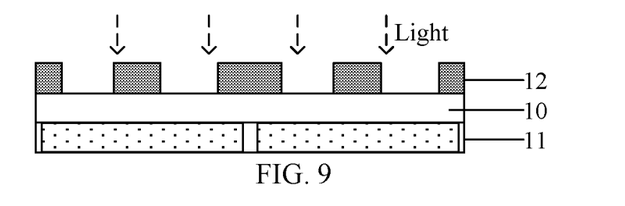
FIG. 9 is a sectional view of the texture recognition device along the section line AA' in FIG. 3 according to some other embodiments of the present disclosure.

In some other embodiments of the present disclosure, as shown in FIG. 9, the optical sensing layer 11 and the light-blocking structure 12 are arranged on different sides of the substrate 10. For example, the light-blocking structure 12 is arranged on the first side of the substrate 10 and the optical sensing layer 11 is arranged on the second side of the substrate 10.

The positions of the optical sensing layer 11, the light-blocking structure 12 and the substrate 10 may be adjusted as long as the light reflected by the finger passes through the light transmission hole group 121 and then is irradiated on the optical sensing group 111.

The light-blocking structure 12 is configured to block ambient light so as to solve the problem of the blurring texture recognition image.

Figure 12:
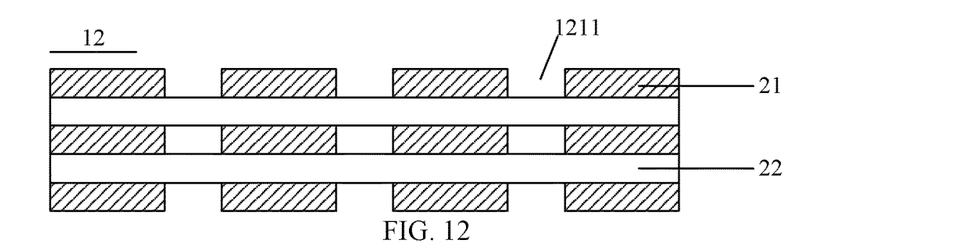
FIG. 12 is a schematic view showing a light-blocking structure according to some embodiments of the present disclosure.

Exemplarily, the light-blocking structure 12 is a light-blocking layer including a plurality of light transmission holes 1211. For another example, as shown in FIG. 12, in the direction from the light-blocking structure 12 to the optical sensing layer 11, the light-blocking structure 12 includes at least three light-blocking layers 21 and light transmission layers 22 each being arranged between two adjacent light-blocking layers 21. The light transmission hole 1211 runs through the at least three light-blocking layers 21.

In the texture recognition device provided by embodiments of the present disclosure, the optical sensing groups 111 corresponds to the light transmission hole groups 121, the orthogonal projection of the optical sensing group 111 on the substrate 10 completely covers the orthogonal projection of the corresponding light transmission hole group 121 on the substrate 10, and the orthogonal projection of the center of the optical sensing group 111 on the substrate 10 coincides with the orthogonal projection of the center of the light transmission hole group 121 corresponding to the optical sensing group 111 on the substrate 10. With the above configuration, light passing through one light transmission hole group 121 is irradiated on only one optical sensing group 111, thereby improving the utilization of the optical sensing groups 111 and the valley-ridge contrast and the accuracy of the fingerprint recognition.

In some embodiments of the present disclosure, p is a product of C and the distance s between centers of two adjacent light transmission holes 1211, p=C×s, $$(C-1) \times s + d + 2h \times \tan\frac{\theta}{2} \leq C \times s \leq K.$$

Figure 10:
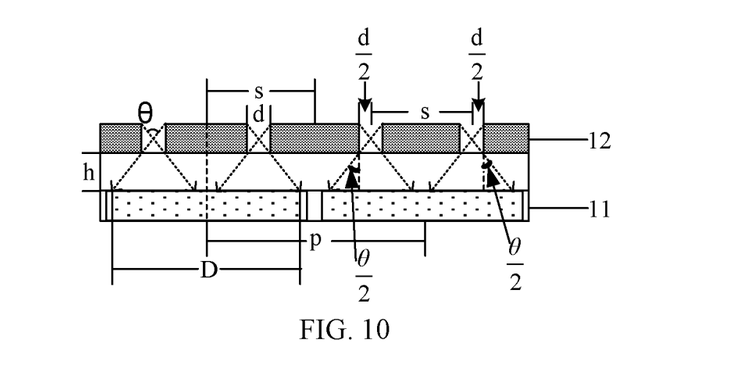
FIG. 10 is a sectional view of the texture recognition device along the section line AA' in FIG. 3 according to some other embodiments of the present disclosure.

As shown in FIG. 10, d denotes an aperture size of the transmission hole 1211, h denotes the distance between the light-blocking structure 12 and the optical sensing layer 11, θ denotes a light convergence angle, p denotes the distance between centers of two adjacent optical sensing groups 111, and K is a constant and denotes a minimum distance between centers of two adjacent optical sensing groups in a case where there is a plurality of optical sensing elements 1111 per inch and each optical sensing group 111 includes at least one optical sensing element 1111.

Figure 11:
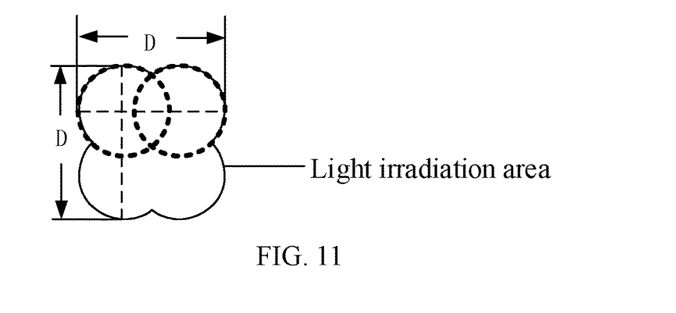
FIG. 11 is a schematic view showing light irradiation areas on optical sensing groups according to some other embodiments of the present disclosure.

For example, as shown in FIG. 11, light from the $C^2$ light transmission holes 121 in the light transmission hole group 121 are irradiated on the optical sensing group 111, and the light irradiation area irradiating on the optical sensing group 111 may be approximately considered as $C^2$ circles. As shown in FIG. 10, in the X direction (the horizontal direction) or the Y direction (the vertical direction) in FIG. 3, a horizontal length or vertical length D of the light irradiation area is:

$$(C-1) \times s + d + 2h \times \tan\frac{\theta}{2},$$

where the horizontal length or vertical length is equal to a length of a straight line whose start point and end point are on a boundary of the light irradiation area, and centers of C neighboring circles are on the line.

In some embodiments of the present disclosure, the shape of the light transmission hole 1211 is circle and d denotes the diameter of the circle.

In some embodiments of the present disclosure, the shape of the light transmission hole 1211 is rectangle and d denotes a length of the diagonal line of the rectangle.

Exemplarily, as shown in FIG. 10, C=2, and $$D = s + d + 2h \times \tan\frac{\theta}{2}.$$

In some embodiments of the present disclosure, as shown in FIG. 10, s denotes the distance between the centers of two adjacent light transmission holes 1211, two adjacent light transmission holes 1211 are spaced apart by a light-blocking part, and the distance between centers of two adjacent light-blocking parts also equals to s. p denotes the distance between the centers of two adjacent optical sensing groups 111, two adjacent optical sensing groups 111 are spaced apart by a non-light-sensing part, and the distance between centers of two non-light-sensing parts is also equal to the distance p. With such configuration, p and s satisfy p=C×s, such that for each light transmission hole group 121, the orthogonal projection of its center on the substrate coincides with an orthogonal projection of the center of the optical sensing group 111 corresponding to the light transmission hole group 121 on the substrate.

In some embodiments of the present disclosure, p is greater than or equal to the horizontal length or vertical length D of the light irradiation area irradiated by the lights passing through one light transmission hole group 121, that is, $$(C-1) \times s + d + 2h \times \tan\frac{\theta}{2} \leq C \times s.$$

With the configuration that p is greater than or equal to D, the light passing through one light transmission hole group 121 is only irradiated on the optical sensing group 111 corresponding to the light transmission hole group 121 and is not irradiated on other optical sensing groups 111.

In some embodiments of the present disclosure, the optical sensing elements 1111 are arranged in a high pixel per inch (PPI) manner. However, the number of optical sensing elements 1111 per inch is limited due to limitation of process condition of the fabrication of the optical sensing layer 11, and the optical sensing group 111 includes at least one optical sensing element 1111. The number of optical sensing groups 111 per inch is determined based on the sizes of the optical sensing element 1111, the distance between adjacent optical sensing elements 1111, and the number of the optical sensing elements 1111 in the optical sensing group 111, and thus is also limited. Therefore, the distance between the centers of two adjacent optical sensing groups 111 has a minimum value K. In view of above, C×s. In a condition where C×s=K, the texture recognition has a maximum accuracy.

With the high PPI configuration of the optical sensing elements 1111, the accuracy of the texture recognition is improved.

In an exemplary example, there are 200 optical sensing elements 1111 per inch, that is, the optical sensing elements 1111 are configured in 200 PPI, K=25.4÷200=0.127 mm.

In view of the above, $$(C-1) \times s + d + 2h \times \tan\frac{\theta}{2} \leq C \times s \leq K.$$

In embodiments of the present disclosure, the distance p between the centers of two adjacent optical sensing groups 111 is determined according to the distance s between the centers of the adjacent light transmission holes 1211 and the number $C^2$ of light transmission holes 1211 in one light transmission hole group 121. The distance p between the centers of two adjacent optical sensing groups 111 is configured to be greater than or equal to the horizontal length or vertical length D of the light irradiation area irradiated by the lights passing through one light transmission hole group 121, such that the light passing through one light transmission hole group 121 only irradiates on the optical sensing group 111 corresponding to the light transmission hole group 121 and does not irradiate on other optical sensing groups 111, thereby improving the utilization of the optical sensing groups 111 and the valley-ridge contrast and the accuracy of the fingerprint recognition.

In some embodiments, as shown in FIG. 10, the distance s between the centers of two adjacent light transmission holes 1211 satisfies $$s = \frac{p}{C},$$

and the aperture sized of the light transmission hole 1211 satisfies $$d = p - (C-1) \times s - 2h \times \tan\frac{\theta}{2}.$$

p denotes the distance between the centers of two adjacent optical sensing groups 111, h denotes the distance between the light-blocking structure 12 and the optical sensing layer 11, and θ denotes a light convergence angle.

For example, as shown in FIG. 11, lights irradiates on the optical sensing groups 111 through the $C^2$ light transmission holes in the light transmission hole group 121, and the light irradiation area on the optical sensing groups 111 is approximately $C^2$ circles. As shown in FIG. 10, in the horizontal direction or the vertical direction, a horizontal length or vertical length D of the light irradiation area is $$(C-1) \times s + d + 2h \times \tan\frac{\theta}{2},$$

where the horizontal length or vertical length is equal to a length of a straight line whose start point and end point are on the boundary of the light irradiation area, and centers of C neighboring circles are on the line.

In some embodiments of the present disclosure, the shape of the light transmission hole 1211 is circle and d denotes the diameter of the circle.

In some embodiments of the present disclosure, the shape of the light transmission hole 1211 is rectangle and d denotes the length of the diagonal line of the rectangle.

Exemplarily, as shown in FIG. 10, C=2, and $$D = s + d + 2h \times \tan\frac{\theta}{2}.$$

In some embodiments of the present disclosure, as shown in FIG. 10, s denotes the distance between the centers of two adjacent light transmission holes 1211, two adjacent light transmission holes 1211 are spaced apart by a light-blocking part, and centers of two adjacent light-blocking parts have a distance equal to the distance s. p denotes the distance between the centers of two adjacent optical sensing groups 111, two adjacent optical sensing groups 111 are spaced apart by a non-light-sensing part, and the distance between centers of two adjacent non-light-sensing parts is also equal to the distance p. Based on such configuration, p and s satisfy p=C×s, such that for each light transmission hole group 121, an orthogonal projection of its center on the substrate coincides with an orthogonal projection of the center of the optical sensing group 111 corresponding to the light transmission hole group 121 on the substrate.

In some embodiments of the present disclosure, when p is greater than or equal to a horizontal length or vertical length D of the light irradiation area irradiated by lights passing through one light transmission hole group 121, p satisfies:

$$(C-1) \times s + d + 2h \times \tan\frac{\theta}{2} = p,$$

$$d = p - (C-1) \times s - 2h \times \tan\frac{\theta}{2}, \text{ and } s = \frac{p}{C}.$$

In the above embodiments of the present disclosure, in a case where p is of a certain value, the distance s between the centers of the adjacent light transmission holes 1211 is determined according to the number $C^2$ of light transmission holes 1211 in one light transmission hole group 121. The distance s between the centers of the adjacent light transmission holes group 121 and the number $C^2$ of light transmission holes 1211 in one light transmission hole group 121 are utilized to make p between the centers of two adjacent optical sensing groups 111 to be equal to the horizontal length or vertical length D of the irradiation area irradiated by lights from one light transmission hole group 121, such that the light from one light transmission hole group 121 only irradiates on the optical sensing group 111 corresponding to the light transmission hole group 121 and does not irradiate on other optical sensing groups 111, thereby improving the utilization of the optical sensing groups 111 and the valley-ridge contrast and the accuracy of the fingerprint recognition.

In some embodiments of the present disclosure, as shown in FIG. 12, in the direction from the light-blocking structure 12 to the optical sensing layer 11, the light-blocking structure 12 includes at least three light-blocking layers 21 and light transmission layers 22 each arranged between two adjacent light-blocking layers 21. The light transmission hole 1211 runs through the at least three light-blocking layers 21.

In some embodiments of the present disclosure, the light-blocking layers 21 each are made of insulation material or metal material. The light-blocking layers 21 except the light transmission holes 1211 have light blocking function.

The more the number of the light-blocking layers 21, the more ambient light the light-blocking structure 12 can block. However, the number of the light-blocking layers 21 is also associated with the thickness of the texture recognition device. The number of the light-blocking layers 21 is determined according to actual needs.

In an exemplary example, the light-blocking structure 12 includes three light-blocking layers 21 and two light transmission layers 22. In another exemplary example, the light-blocking structure 12 includes four light-blocking layers 21 and three light transmission layers 22. In yet another exemplary example, the light-blocking structure 12 includes ten light-blocking layers 21 and nine light transmission layers 22.

In the above embodiments of the present disclosure, the light-blocking structure 12 includes at least three light-blocking layers 21 and light transmission layers 22 each being arranged between two adjacent light-blocking layers 21, the light transmission layer 22 is used for adjusting the distance between adjacent light-blocking layers 21, which obtains a desired width-depth ratio of the light transmission hole 1211 and further realizes a desired light convergence angle.

Compared with the scheme that one light-blocking structure consists of one light-blocking layer including a plurality of light transmission holes, the light-blocking structure 12 provided by the present disclosure improves the accuracy of the fingerprint recognition.

Figure 13:
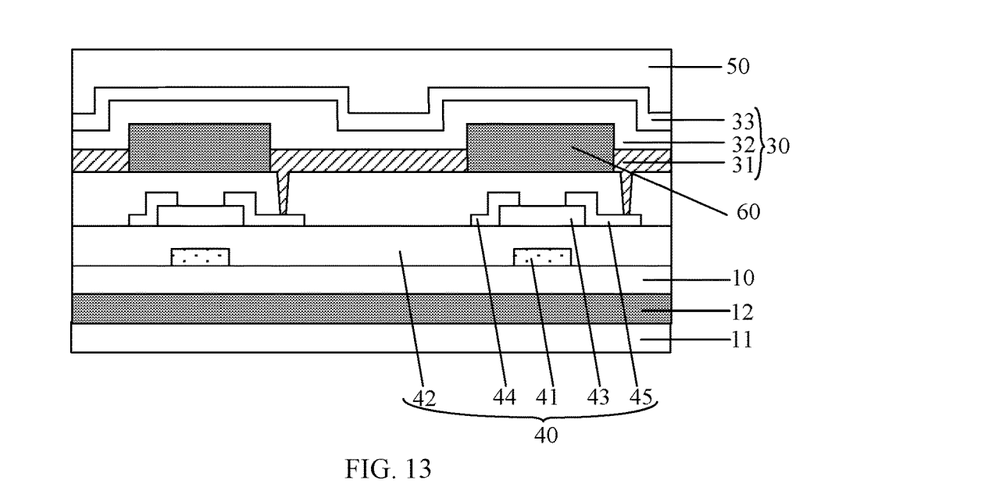
FIG. 13 is a schematic view showing a display panel according to some embodiments of the present disclosure.

Various embodiments of the present disclosure provide a display panel. As shown in FIG. 13, the display panel includes the texture recognition device in any one of the above embodiments and a luminescent device 30. The luminescent device 30 includes a light emission side and a backlight side arranged opposite to the light emission side. The texture recognition device is arranged on the backlight side of the luminescent device 30, and the light-blocking structure 12 is arranged on a side of the optical sensing layer 11 close to the luminescent device 30.

In some embodiments of the present disclosure, the display panel is a self-luminous display panel, and the luminescent device 30 is a self-luminous device.

In some embodiments of the present disclosure, the luminescent device 30 includes an anode layer 31, a light emitting layer 32 and a cathode layer 33, which are stacked in order.

In some embodiments of the present disclosure, the luminescent device 30 is in a top emission structure.

In some embodiments of the present disclosure, the display panel further includes an encapsulation layer 50.

In one or more embodiments of the present disclosure, the display panel is an organic light-emitting diode (OLED) display panel. In one or more embodiments of the present disclosure, the display panel is a quantum dot display panel.

The display panel provided by the above embodiments of the present disclosure includes the texture recognition device, one optical sensing groups 111 corresponds to one light transmission hole group 121, the orthogonal projection of the optical sensing group 111 on the substrate 10 completely covers the orthogonal projection of a corresponding light transmission hole group 121, and the orthogonal projection of the center of the optical sensing group 111 on the substrate 10 coincides with the orthogonal projection of the center of the light transmission hole group 121 corresponding to the optical sensing group 111 on the substrate 10, such that light from one light transmission hole groups 121 is irradiated on only one optical sensing group 111, thereby improving the utilization of the optical sensing groups 111 and the valley-ridge contrast and the accuracy of the fingerprint recognition.

In some embodiments of the present disclosure, as shown in FIG. 13, the display panel further includes a thin film transistor 40. The thin film transistor 40 is arranged on the substrate 10 of the texture recognition device. A drain 45 of the thin film transistor 40 is electrically connected to the anode layer 31 of the luminescent device 30.

In some embodiments of the present disclosure, the thin film transistor 40 further includes a gate 41, a gate insulation layer 42, an active layer 43, and a source 44.

In some embodiments of the present disclosure, as shown in FIG. 13, the thin film transistor 40 is a bottom gate thin film transistor.

In some embodiments of the present disclosure, the thin film transistor 40 is a top gate thin film transistor.

In some embodiments of the present disclosure, the thin film transistor 40 is a double gate thin film transistor.

In some embodiments of the present disclosure, the active layer 43 is made of amorphous silicon. In some embodiments of the present disclosure, the active layer 43 is made of oxide semiconductor. In some embodiments of the present disclosure, the active layer 43 is made of organic material.

In some embodiments of the present disclosure, the thin film transistor 40 is of a back channel etched (BCE) structure, or is of an etching stop (ESL) structure. The type of the thin film transistor 40 is determined according to the material of the active layer 43 and the process of forming the source 44 and the drain 45.

In some embodiments of the present disclosure, the substrate 10 of the texture recognition device further serves as the base substrate of an array substrate of the display panel. The substrate 10 has a firs side close to the luminescent device 30 and a second side away from the luminescent device 30. As shown in FIG. 5 and FIG. 6, the optical sensing layer 11 and the light-blocking structure 12 are both arranged on the first side of the substrate 10 and are stacked on the substrate 10 in order.

In some embodiments of the present disclosure, as shown in FIG. 8, the optical sensing layer 11 and the light-blocking structure 12 are both arranged on the second side of the substrate 10 and are stacked on the substrate 10 in order.

In some embodiments of the present disclosure, as shown in FIG. 9, the light-blocking structure 12 is arranged on the first side of the substrate 10, and the optical sensing layer 11 is arranged on the second side of the substrate 10.

In some embodiments of the present disclosure, as shown in FIG. 13, the display panel further includes pixel defining layer 60.

Figure 14:
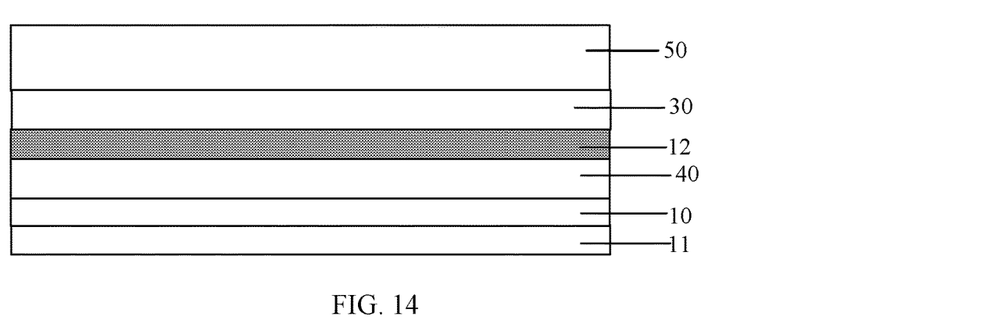
FIG. 14 is a schematic view showing a display panel according to some other embodiments of the present disclosure.

In some embodiments of the present disclosure, as shown in FIG. 14, the light-blocking structure 12 is arranged on the first side of the substrate 10, and the light-blocking structure 12 is arranged on a side of the thin film transistor 40 close to the luminescent device 30.

Figure 15:
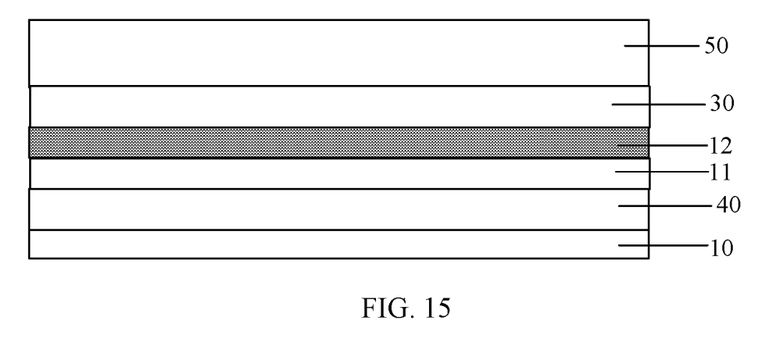
FIG. 15 is a schematic view showing a display panel according to some other embodiments of the present disclosure.

In some embodiments of the present disclosure, as shown in FIG. 15, both the light-blocking structure 12 and the optical sensing layer 11 are arranged on the first side of the substrate 10, and both the light-blocking structure 12 and the optical sensing layer 11 are arranged on the side of the thin film transistor 40 close to the luminescent device 30.

In some embodiments of the present disclosure, the light-blocking structure 12 is arranged on a side of the thin film transistor 40 away from the luminescent device 30.

In some embodiments of the present disclosure, as shown in FIG. 13, both the light-blocking structure 12 and the optical sensing layer 11 are arranged on the side of the thin film transistor 40 away from the luminescent device 30.

With the above structure configurations, the thin film transistor 40 is insulated from the light-blocking structure 12, and the thin film transistor 40 is insulated from the optical sensing layer 11, and the texture recognition is not affected by the thin film transistor 40.

In the above embodiments of the present disclosure, the substrate 10 of the texture recognition device is multiplexed as the base substrate of the array substrate of the display panel, which reducing the thickness of the display panel and facilitating the thinning design of the display panel.

The above is merely exemplary embodiments of the present disclosure, but the scope of the present disclosure is not limited thereto. Any other changes or substitutions easily conceived within the technical scope of the present disclosure by those skilled in the art fall into the scope of the disclosure. Therefore, the scope of protection of the present disclosure should be determined by the scope of the claims.

What is claimed is:

1. A texture recognition device, comprising: a substrate, an optical sensing layer, and a light-blocking structure, wherein the optical sensing layer and the light-blocking structure are stacked on the substrate;

the light-blocking structure comprises a plurality of light transmission hole groups, at least one of the plurality of light transmission hole groups comprises $C^2$ light transmission holes, and C is a positive integer;

the optical sensing layer comprises a plurality of optical sensing groups; and the plurality of optical sensing groups corresponds to the plurality of light transmission hole groups respectively, an orthogonal projection of one optical sensing group of the plurality of optical sensing groups on the substrate completely covers an orthogonal projection of a corresponding light transmission hole group of the plurality of light transmission hole groups on the substrate, and an orthogonal projection of a center of the optical sensing group on the substrate coincides with an orthogonal projection of a center of the corresponding light transmission hole group on the substrate, wherein the optical sensing layer is arranged on a first side of the substrate and the light-blocking structure is arranged on a second side of the substrate, wherein the first side and the second side are arranged opposite to each other, in a direction from the light-blocking structure to the optical sensing layer, the light-blocking structure comprises at least three light-blocking layers and light transmission layers each disposed between adjacent light-blocking layers of the at least three light-blocking layers, wherein each of the $C^2$ light transmission holes runs through the at least three light-blocking layers.

2. The texture recognition device according to claim 1, wherein $$(C-1) \times s + d + 2h \times \tan\frac{\theta}{2} \le C \times s \le K, \text{ and } p = C \times s,$$

wherein d denotes an aperture size of each of the $C^2$ transmission holes, h denotes a distance between the light-blocking structure and the optical sensing layer, θ denotes a light convergence angle, s denotes a distance between centers of two adjacent light transmission holes of the $C^2$ light transmission holes, p denotes a distance between centers of two adjacent optical sensing groups of the plurality of optical sensing groups, and K is a constant and denotes a minimum distance between the centers of two adjacent optical sensing groups in a case where there is a plurality of optical sensing elements per inch and each of the plurality of optical sensing groups comprises at least one optical sensing element.

3. The texture recognition device according to claim 1, wherein a distance s between centers of two adjacent light transmission holes of the $C^2$ light transmission holes satisfies:

$$s = \frac{p}{C};$$

wherein p denotes a distance between centers of two optical sensing groups of the plurality of optical sensing groups.

4. The texture recognition device according to claim 3, wherein an aperture size d of each of the $C^2$ light transmission holes satisfies:

$$d = p - (C-1) \times s - 2h \times \tan\frac{\theta}{2},$$

wherein h denotes a distance between the light-blocking structure and the optical sensing layer, and θ denotes a light convergence angle.

5. The texture recognition device according to claim 1, wherein at least one of the plurality of optical sensing groups comprises one optical sensing element.

6. A display panel, comprising: a luminescent device and the texture recognition device according to claim 1, wherein the luminescent device comprises a light emission side and a backlight side arranged opposite to the light emission side, the texture recognition device is arranged on the backlight side of the luminescent device, and the light-blocking structure is arranged at a side of the optical sensing layer close to the luminescent device.

7. The display panel according to claim 6, wherein $$(C-1) \times s + d + 2h \times \tan\frac{\theta}{2} \le C \times s \le K, \text{ and } p = C \times s,$$

wherein d denotes an aperture size of each of the $C^2$ transmission holes, h denotes a distance between the light-blocking structure and the optical sensing layer, θ denotes a light convergence angle, s denotes a distance between centers of two adjacent light transmission holes of the $C^2$ light transmission holes, p denotes a distance between centers of two adjacent optical sensing groups of the plurality of optical sensing groups, and K is a constant and denotes a minimum distance between the centers of two adjacent optical sensing groups in a case where there is a plurality of optical sensing elements per inch and each of the plurality of optical sensing groups comprises at least one optical sensing element.

8. The display panel according to claim 6, wherein a distance s between centers of two adjacent light transmission holes of the $C^2$ light transmission holes satisfies:

$$s = \frac{p}{C};$$

wherein p denotes a distance between centers of two optical sensing groups of the plurality of optical sensing groups.

9. The display panel according to claim 8, wherein an aperture size d of each of the $C^2$ light transmission holes satisfies:

$$d = p - (C-1) \times s - 2h \times \tan\frac{\theta}{2},$$

wherein h denotes a distance between the light-blocking structure and the optical sensing layer, and θ denotes a light convergence angle.

10. The display panel according to claim 6, wherein at least one of the plurality of optical sensing groups comprises one optical sensing element.

11. The display panel according to claim 6, further comprising a thin film transistor disposed on the substrate, wherein a drain of the thin film transistor is electrically connected to an anode layer of the luminescent device.

12. The display panel according to claim 11, wherein the optical sensing layer and the light-blocking structure are both arranged on a side of the thin film transistor away from the luminescent device.

13. The display panel according to claim 6, wherein the self-luminous display panel is an organic light-emitting diode (OLED) display panel or a quantum dot display panel.

* * * * *